United States Patent [19]
Hardy et al.

[11] Patent Number: 4,471,355
[45] Date of Patent: Sep. 11, 1984

[54] METHOD AND APPARATUS FOR SENSING CURRENT IN HIGH VOLTAGE CONDUCTORS

[75] Inventors: Robert H. S. Hardy, Regina; Jay E. Beattie, Indian Head, both of Canada

[73] Assignee: Saskatchewan Power Corporation, Regina, Canada

[21] Appl. No.: 264,655

[22] Filed: May 18, 1981

[30] Foreign Application Priority Data

Sep. 17, 1980 [CA] Canada .................................. 360520

[51] Int. Cl.$^3$ .............................................. H04B 9/00
[52] U.S. Cl. .................................. 340/870.31; 324/96; 340/664; 340/870.29; 455/612
[58] Field of Search ....................... 340/870.31, 870.19, 340/870.26, 870.29, 870.16, 870.01, 664, 660; 324/96, 72.5, 149, 158 P; 455/612, 608

[56] References Cited

U.S. PATENT DOCUMENTS

| 3,488,586 | 1/1970 | Watrous et al. ..................... 324/96 |
| 3,506,833 | 4/1970 | Von Willison ................. 340/870.29 |
| 3,590,374 | 6/1971 | Evans et al. ......................... 324/127 |
| 3,939,412 | 2/1976 | Hermstein et al. .................. 324/96 |
| 4,012,633 | 3/1977 | Huntley ............................... 455/612 |
| 4,070,572 | 1/1978 | Summerhayes ..................... 324/96 |

OTHER PUBLICATIONS

Stoli, R. L., "Method of Measuring Alternating Currents Without Disturbing the Conducting Circuit" Proceedings IEEE, vol. 122, No. 10, Oct. 1975, pp. 1166–1167.
Giacoletto, Electronics Designers' Handbook, 2nd Ed., McGraw-Hill Book Co., 1977, pp. 11–19.
Braun, A. et al., "Optoelectronic ... Meter for High-V. Lines" IEEE Trans. on Inst. & Meas., IM-22, 4, pp. 394–399, Dec. 1973.

Primary Examiner—Glen R. Swann, III
Attorney, Agent, or Firm—Chernoff, Vilhauer, McClung, Birdwell & Stenzel

[57] ABSTRACT

Alternating current carried in a high voltage conductor is sensed by a toroidal coil to produce a first low level signal representative of the alternating current signal. Transmitter means operating at or near the potential of the conductor and remote from electrical ground receives the low level signal and in response produces a series of modulated pulses containing amplitude and phase angle replica information representative of the high voltage alternating current signal. Advantageously, the transmitter may be powered by a power supply deriving power from the high voltage conductor. The pulses produced by the transmitter may be transmitted to a receiver operating at or near ground potential, which receiver then converts the pulses into a second low level signal representative of the high voltage alternating current signal in both amplitude and phase angle.

32 Claims, 12 Drawing Figures

METHOD AND APPARATUS FOR SENSING CURRENT IN HIGH VOLTAGE CONDUCTORS

BACKGROUND OF THE INVENTION

This invention relates to methods and apparatus for sensing alternating current signals in high voltage conductors.

In the design of high voltage current sensing and measuring apparatus, conventional devices (typically utilizing transformers) have employed magnetic coupling phenomena for sensing and measuring current. Typically, the transformers have been terminated in very low impedances, thereby necessitating the use of iron cores to increase the transformer magnetizing inductance to yield a desired degree of proportionality between transformer primary and secondary current. Disadvantages associated with the use or iron-core transformers include the possibility of saturation of the core during the occurrence of a high fault current, the possibility that the iron core may exhibit residual magnetism after the occurrence of a high fault current, and the possibility that the magnetic hysterisis of the core material may introduce inaccuracies in the current replica signal produced by the transformer.

Hall Effect devices have also been used as current sensing and measuring devices, but have proven disadvantageous due to the excessive dependence of the Hall voltage on temperature and due to the necessity to provide an accurate, stable bias current to the Hall Effect device.

These disadvantages reduce the accuracy of the current replica signal produced by such conventional current sensing and measuring apparatus. This in turn limits the usefulness of such apparatus in power systems which utilize components such as solid state fault detectors which require, as an input, replica signals closely proportional to the actual system current and voltage signals.

A further problem with which the designers of high voltage electronic current sensing and measuring apparatus have had to cope is the prevention of short circuiting of the high voltage conductor through the current sensing and measuring apparatus. The close physical proximity required to ensure adequate magnetic coupling between the primary and secondary winding of a conventional current transformer makes electrical insulation of the primary and secondary windings progressively more difficult and expensive as the voltage of the conductor increases.

An object of the present invention is to provide a new and improved method and apparatus for sensing current in high voltage conductors and, in so doing, to substantially avoid problems associated with the use of iron-core transformers or Hall Effect devices, and also to avoid the problem of short circuiting through the current sensing apparatus.

A further object of the present invention is to provide a new and improved method and apparatus for sensing a current in high voltage conductors which utilizes input power from the high voltage conductor in the performance of the method and in the operation of the apparatus.

SUMMARY OF THE INVENTION

In accordance with the present invention, there is provided current sensing apparatus for sensing and producing an amplitude and phase angle replica of a high voltage alternating current signal carried in a high voltage conductor, the apparatus comprising a toroidal coil encircling the high voltage conductor for producing a low level electrical signal representative of the time derivative of the high voltage alternating current signal, and transmitter means electrically connected to the coil and presenting a high input resistance thereto. The transmitter means is operative at or near the electrical potential of the conductor and remote from electrical ground for receiving the first low level signal and for producing in response thereto a series of modulated pulses of electromagnetic energy containing amplitude and phase angle replica information representative of the high voltage alternating current signal.

The use of a toroidal coil, terminated by the high input resistance of the transmitter means, alleviates deficiencies associated with iron-core transformers because relatively little current is drawn from the coil and an increased magnetizing inductance is not required. Preferably, the toroidal coil comprises a magnetically non-saturating core material. Such material may be a non-magnetic material, a non-saturating material such as ferrite, or a magnetic material which includes a discontinuity (such as an air gap) for preventing saturation.

Typically, the high voltage alternating current will have a frequency of 60 Hz. For this frequency, the ratio of the self-inductance of the toroidal coil to the input resistance of the transmitter means is preferably of the order of 20 microseconds or less.

In a preferred embodiment of the present invention, the series of modulated pulses produced by the transmitter means is produced in the form of a series of frequency modulated pulses, the frequency of which is a function of the amplitude of the high voltage alternating current signal. Further, the pulses produced are preferably light energy pulses. However, it is to be understood that the modulating technique used need not be pulse frequency modulation. Other types of modulation could be used; for example, phase modulation. Preferably, the average frequency of the pulses is much greater than the frequency of the high voltage alternating current signal. For example, in situations where the frequency of the high voltage alternating current signal is about 60 Hz, the average frequency of the pulses is preferably of the order of 100 KHz.

The pulses produced by the transmitter means can be transmitted to receiver means operating at or near electrical ground potential for receiving the transmitted pulses and converting (or demodulating) them into a second low level electrical signal representative of the high voltage alternating current signal in both amplitude and phase angle. Where the pulses produced by the transmitter means are light energy pulses, optical transmission line means such as a glass fibre (or fibreoptic) cable interconnecting the transmitter means and the receiver means may serve as the transmission medium.

Thus, it will be appreciated that the present invention avoids the short circuiting problem discussed above because it contemplates the division of the current sensing apparatus into a sensor/transmitter portion maintained at or near the electrical potential of the high voltage conductor and a receiver portion maintained at or near ground potential.

Of course, operating power for the current sensing apparatus may be derived in various ways. However, advantageously, direct current operating power may be provided to the transmitter means by power supply means operatively connected to the high voltage conductor and to the transmitter means for receiving input power from the high voltage conductor and providing direct current operating power to the transmitter means. Generally, it is then not necessary to independently supply power to the transmitter means—which may in itself cause electrical insulation problems if the power is delivered up from ground potential.

In a preferred embodiment of the present invention, the power supply means for providing direct current operating power to the transmitter means comprises a cylindrical metallic structure supported remote from electrical ground potential and in co-axial alignment around the high voltage conductor. Capacitor means is electrically connected between the high voltage conductor and the metallic structure for providing in response to the flow of high voltage alternating current in the high voltage conductor an alternating current voltage the magnitude of which is dependent upon the capacitance of the capacitor means and upon stray capacitance between the metallic structure and electrical ground. Power conditioning means is electrically connected between the capacitor means and the transmitter means for receiving the alternating current voltage provided by the capacitor means and for providing in response thereto the required direct current operating power. Advantageously, the cylindrical metallic structure may house not only the capacitor means but also the toroidal coil and the transmitter means thereby isolating these elements from the surrounding environment.

In accordance with the present invention, there is provided a method for sensing and producing an amplitude and phase angle replica of a high voltage alternating current signal, carried in a high voltage conductor. The method firstly comprises the step of sensing the high voltage alternating current signal and producing at or near the electrical potential of the high voltage conductor a first low level electrical signal representative of the time derivative thereof. The low level signal so produced is then converted into a series of modulated pulses of electromagnetic energy (preferably light energy) wherein at least one of the pulse parameters is a function of the amplitude of the high voltage alternating current signal; for example, a series of frequency modulated pulses as described above. The series of modulated pulses are then transmitted (as, for example, by an electrically insulating and optically conducting glass fibre cable) to receiving apparatus operating at or near electrical ground potential and remote from the electrical potential of the high voltage conductor. The transmitted pulses are then received and converted (or demodulated) into a second low level electrical signal representative of the high voltage alternating current signal in both amplitude and phase angle.

Advantageously, input power from the high voltage conductor may be used in the performance of the steps up to and including the step of transmitting the series of modulated pulses. Alternating current power may be taken from the high voltage conductor and converted into a useable direct current power at or near the electrical potential of the high voltage conductor.

BRIEF DESCRIPTION OF THE DRAWINGS

The invention will now be described with reference to the drawings in which.

DETAILED DESCRIPTION

While the invention is now to be described in connection with certain preferred embodiments, it is to be understood that it is not intended to limit the invention to the particular embodiments described. On the contrary, it is intended to cover all alternatives, modifications and equivalents as may be included within the spirit and scope of the invention as defined by the claims.

Figure 1:
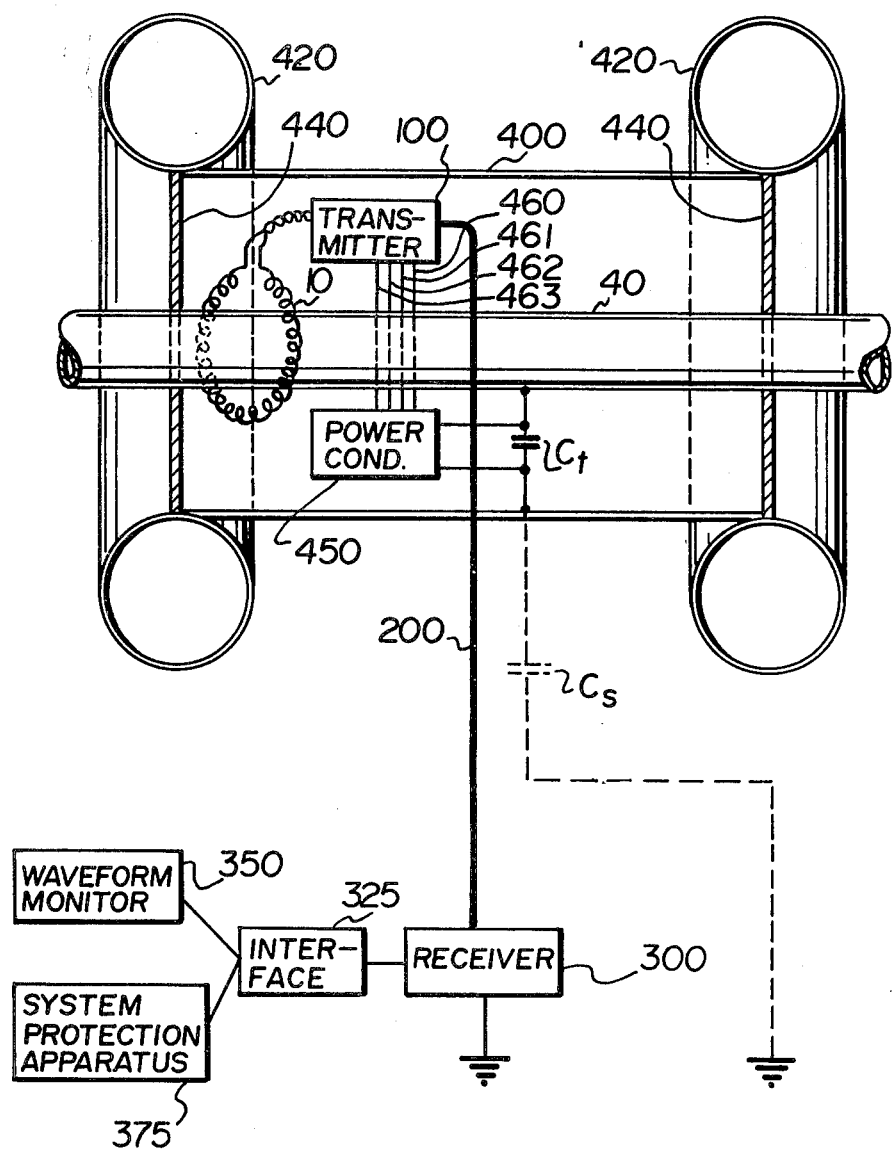
FIG. 1 is a schematic diagram showing current sensing apparatus in accordance with the present invention.

FIG. 1 depicts a portion of a high voltage conductor 40 (such as a high voltage bus or aerial line) which carries a high voltage alternating current signal. A toroidal coil 10 encircles the high voltage conductor for producing a first low level electrical signal representative of the high voltage alternating current signal. Toroidal coil 10 is wound on a magnetically non-saturating core. This may be a non-magnetic material, ferrite, or a magnetic material which includes a discontinuity for preventing saturation. A magnetic material core having an air gap discontinuity has been used with good results.

Transmitter 100 operatively connected and presenting a high input resistance to toroidal coil 10 receives the first low level electrical signal and produces in response thereto pulses of electromagnetic energy in the form of a series of frequency modulated light energy pulses, the frequency of which is a function of the amplitude of the high voltage alternating current signal. Transmitter 100 is operated at or near the electrical potential of conductor 40 and remote from electrical ground. Fibreoptic cable 200 provides an optical transmission line means for transmitting the light energy pulses produced by transmitter 100 from transmitter 100 to a receiver 300 operating at or near electrical ground. Receiver 300 receives the light energy pulses and converts them into a second low level electrical signal representative of the high voltage alternating current signal. The second low level signal, with appropriate interfacing, can be used for a variety of purposes. By way of example, FIG. 1 shows a waveform monitor 350 which, through interface 325, monitors the signal output of receiver 300. The output of receiver 300 is also provided as an input through interface 325 to system protection apparatus 375. Such protection apparatus may be used, for example, to trip circuit breakers controlling power to high voltage conductor 40 when current in the conductor (as represented by the second low level signal) exceeds a predetermined maximum level.

FIG. 1 also depicts a unique power supply apparatus for providing direct current power to transmitter 100. Such apparatus comprises a substantially cylindrical metallic structure 400 co-axially aligned around conductor 40. A pair of toroidal corona rings 420 cap each end of cylinder 400 to reduce the possibility of corona discharge. Electrical insulating discs 440 formed from an electrically non-conducting material are inserted at each end of cylinder 400 to support and electrically insulate the cylinder from conductor 40. Conductor 40 extends through apertures centrally located in each disc 440. A capacitor $C_t$ having a selected capacitance is connected between conductor 40 and cylinder 400. The value of this capacitance together with the value of stray capacitance between cylinder 400 and electrical ground will determine the electrical potential which occurs between conductor 40 and cylinder 400 as a function of the electrical potential between conductor 40 and ground. In FIG. 1, the stray capacitance is symbolically represented by capacitor $C_s$ shown in broken lines because it is not a physical element per se.

When high voltage alternating current passes through conductor 40, current flows through capacitors $C_t$ and $C_s$ to electrical ground. The flow of current through capacitor $C_t$ causes a voltage to develop across the capacitor. Power conditioning means 450 utilizes the voltage developed across capacitor $C_t$ for providing direct current operating power to transmitter 100. As shown in FIG. 1, operating power from power conditioning means 450 to transmitter 100 is provided by means of four interconnecting electrical paths 460, 461, 462 and 463. Three of the paths indicate that transmitter 100 is powered at three different operating voltage levels; the fourth path is representative of a ground return between transmitter 100 and power conditioning means 450.

In FIG. 1, toroidal coil 10, transmitter 100, capacitor $C_t$ and power conditioning means 450 are all housed within metallic structure 400. These elements are thus isolated from the surrounding weather and environment.

Various portions of the current sensing apparatus shown in FIG. 1 will now be described in more detail.

Figure 2:
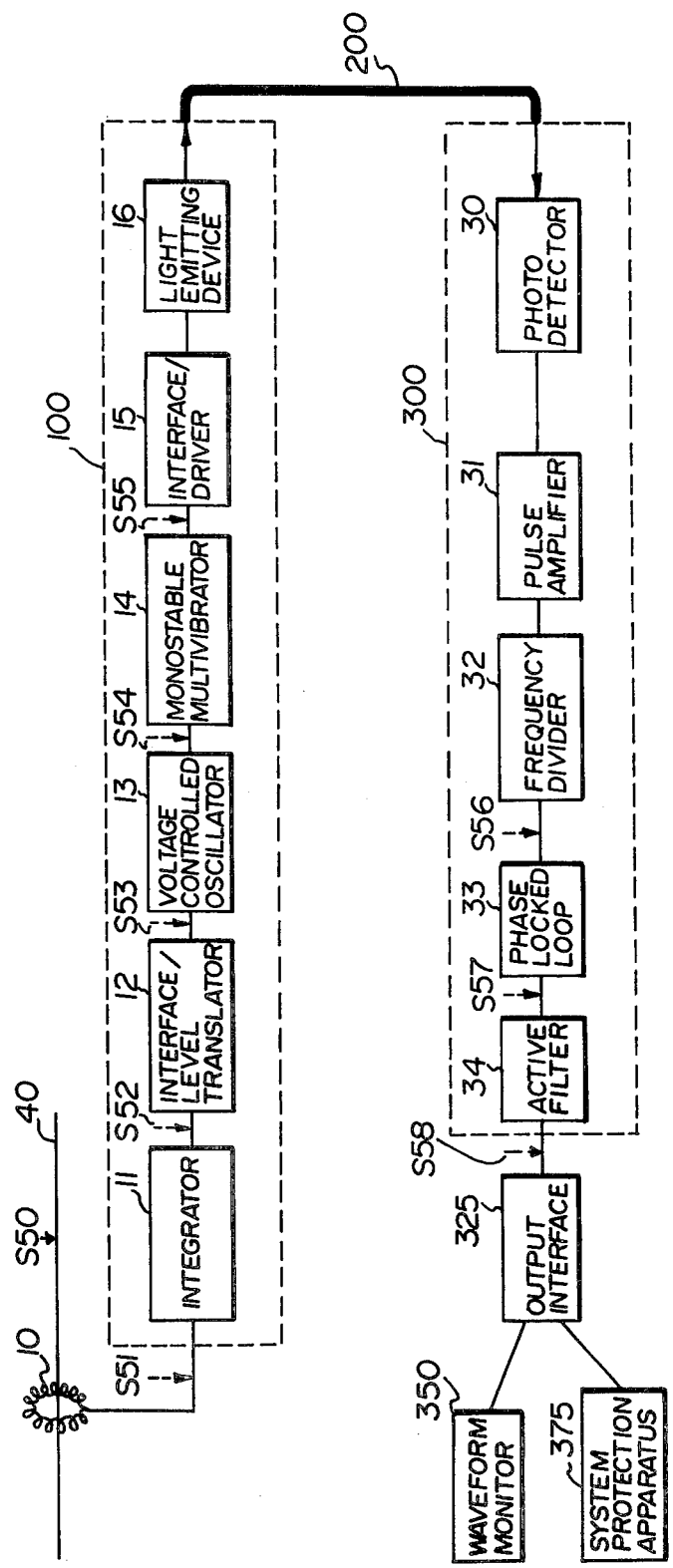
FIG. 2 is a block diagram showing in more detail the transmitter and receiver portions of the current sensing apparatus of FIG. 1.

Transmitter 100 and receiver 300 are shown in more detail in FIG. 2. Representative signal waveforms, shown in two columns in FIG. 3, may be examined in conjunction with the following description for a better understanding of the apparatus shown in FIGS. 1 and 2.

Figure 3:
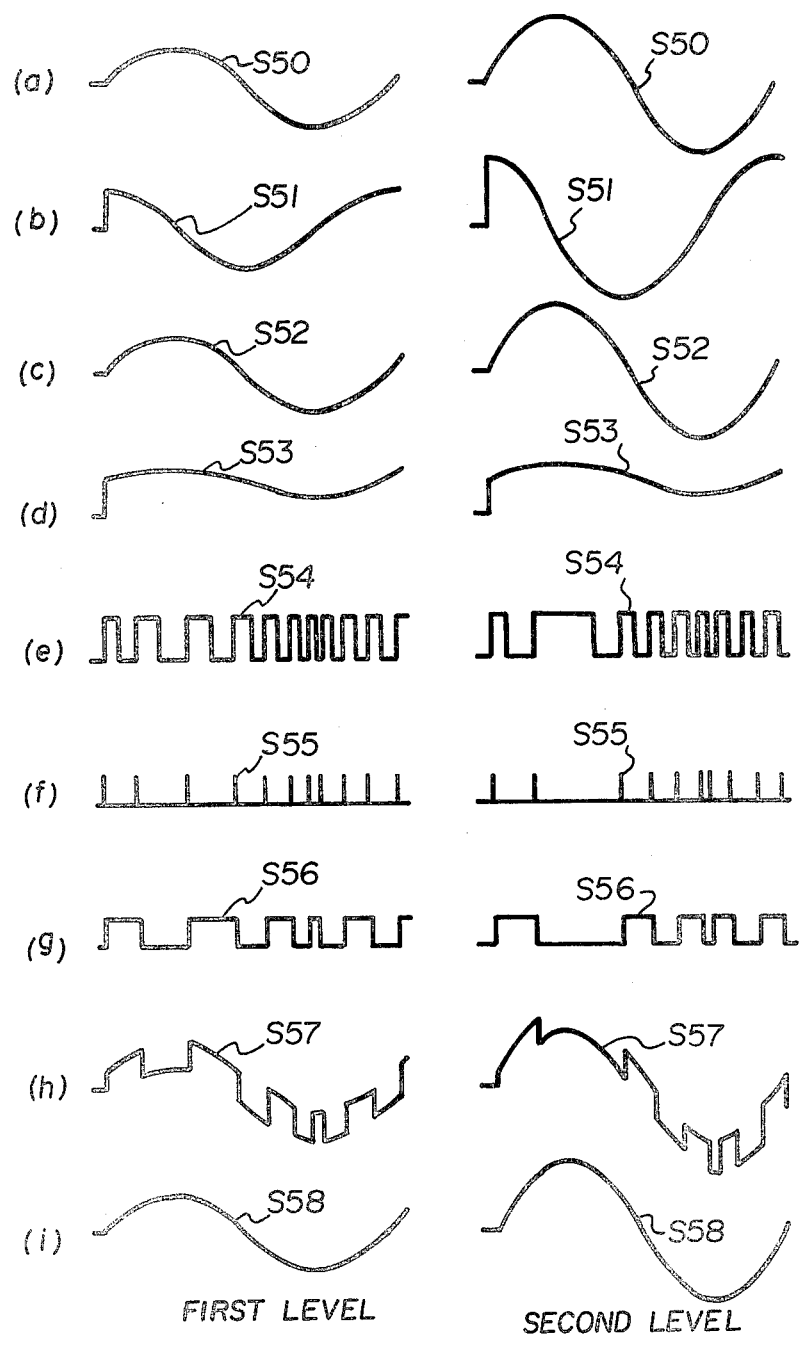
FIGS. 3(a)-3(i) show representative waveforms produced at selected points in the current sensing apparatus of FIG. 2.

In FIG. 3, the two columns of waveforms are intended to represent waveforms for two different levels of high voltage alternating current in conductor 40. In the first column of FIG. 3, a sinusoidal high voltage alternating current signal S50 flowing in conductor 40 is depicted at a first level of peak amplitude. In the second column of FIG. 3, signal S50 is depicted at a second and higher level of peak amplitude. The series of waveforms appearing below waveform S50 in the first and second columns depict representative waveforms at various locations in the current sensing apparatus for the respective levels in peak amplitude of signal S50.

In FIG. 3(a), current amplitude is plotted as the ordinate versus time as the abscissa. In FIGS. 3(b) through 3(i), voltage amplitude is plotted as the ordinate versus time as the abscissa. It is to be understood that certain of the representative signal waveforms shown in FIG. 3 use an exaggerated time scale for purposes of illustration only. In particular, in FIGS. 3(e) through 3(h) the carrier frequency (as hereinafter described) is shown as a much lower frequency (relative to the frequency of high voltage alternating current signal S50) than would normally be used. Typically, the frequency of high voltage alternating current signal S50 would be about 60 Hz, and the carrier frequency would be about 100 KHz.

Referring now to FIGS. 2 and 3, high voltage alternating current signal S50 in conductor 40 produces a time varying magnetic field about conductor 40 which induces a low level electrical signal S51 (see FIG. 3(b)) at the output of toroidal coil 10. Signal S51 is proportional to the time derivative of the magnetic field strength. Signal S51 is provided as an input to high input resistance electronic integrator 11 of transmitter 100. Integrator 11 integrates signal S51 to yield at its output a replica signal S52 (see FIG. 3(c)) of signal S50. The input resistance of integrator 11 should preferably be much higher than the self-inductance of toroidal coil 10 in order to ensure that low level signal S51 will be accurately proportional to the time derivative of signal S50 and not appreciably affected in either magnitude or phase angle by the self-inductance of toroidal coil 10. As noted above, the ratio of self-inductance of the toroidal coil to input resistance is preferably of the order of 20 microseconds or less where the high voltage alternating current signal (S50) has a frequency of 60 Hz. If the ratio is less than about 23 microseconds, then the phase shift of signal S51 from the true time derivative of signal S50 will be less than 0.5 degrees.

The amplitude and reference voltage level of replica signal S52 are changed by interface/level translator 12 to produce a signal S53 (see FIG. 3(d)) suitable for input to voltage controlled oscillator 13. Signal S53 has the same waveshape as signal S50 but is superimposed on a DC biasing level. Interface/level translator 12 translates the DC level of signal S52 but without introducing phase shift as would be introduced through the use of a coupling capacitor. In general, to minimize phase shift, all modulating signal portions of the circuitry of transmitter 100 and receiver 300 should be DC coupled to the extent possible, rather than capacitive coupled.

Voltage controlled oscillator 13 generates at its output a carrier frequency pulse signal which has a centre frequency (e.g. 100 KHz) much greater than that of signal S50 (e.g. 60 Hz), but which varies as a function of the amplitude of input signal S53. In effect, the frequency of output pulse signal S54 from voltage controlled oscillator 13 is modulated by the instantaneous value of signal S53. As can be seen in FIG. 3(e), pulse frequency decreases as signal S53 increases and increases as signal S53 decreases. Monostable multivibrator 14 modifies frequency modulated signal S54 to produce a pulse train signal S55 (see FIG. 3(f)) which has a low duty cycle and which, through interface/driver 15, is provided as an input to light emitting device 16. A low duty cycle is preferable to reduce the power required to operate transmitter 100 (including light emitting device 16). With a low duty cycle, light emitting device 16 is conductive for a comparatively short time during each cycle of operation of voltage controlled oscillator 13.

Interface/driver 15 amplifies pulse train signal S55 to provide sufficient power to drive light emitting device 16. The output of light emitting device 16, which is also the output of transmitter 100, is a frequency modulated series of pulses of light energy, the frequency of which is a function of the amplitude of high voltage alternating current signal S50.

Fibreoptic cable 200 transmits the frequency modulated series of light energy pulses from transmitter 100 to photodetector 30 of receiver 300. Preferably, cable 200 is encased in a suitable sheathing material to provide mechanical rigidity. Of course, the entire cable structure is electrically insulating.

The frequency modulated series of light energy pulses received by photodetector 30 of receiver 300 are translated by the photodetector into a corresponding series of electrical pulses which are amplified by pulse amplifier 31 to a level sufficient to drive frequency divider 32. At the output of pulse amplifier 31, the signal has a low duty cycle similar to that of signal S55. Frequency divider 32 halves the frequency of the low duty cycle signal produced by pulse amplifier 31 and yields a 50 percent duty cycle signal S56 (see FIG. 3(g)) suitable for input to phase locked loop 33. Phase locked loop 33 demodulates signal S56 to produce output signal S57 (see FIG. 3(h)), the amplitude of which varies as a function of the frequency variation of signal S56. The high frequency carrier component of signal S57 which is illustrated in FIG. 3(h) is removed by active filter 34 to yield an output signal S58 which is a replica of high voltage alternating current signal S50 and which is also the output of receiver 300.

As in the case of FIG. 1, FIG. 2 shows (for purposes of illustration only) the output from receiver 300 being provided through an interface 325 to a waveform monitor 350 and to system protection apparatus 375. The interface acts as a buffer so that the loads presented by waveform monitor 350 and system protection apparatus 375 do not appreciably affect the operation of active filter 34. Of course, interface 325 could be considered as a part of receiver 300 rather than as a separate element.

The design of the various elements of the current sensing apparatus depicted in FIG. 2 will generally be well within the ability of those skilled in the art in the light of the present teachings. However, it is considered that some additional comments should be made particularly with regard to the design of active filter 34 and phase locked loop 33.

Typically, it is desired to produce a replica signal (S58) which is "in phase" to within 1° or less with the high voltage alternating current signal (S50). Thus, it is of great importance to minimize phase shift in the design of the active filter 34.

Conventional design of active filter 34 would simply seek to suppress high frequency carrier components in output signal S57 of phase locked loop 33 by setting the cut-off frequency of the filter pass band just above the highest expected frequency of interest in high voltage alternating current signal S50. However, such a simplified design technique would introduce a phase shift in the pass band of the filter which could be unacceptably large for high voltage alternating current measurement applications.

A low phase shift and a high value of attenuation of the high frequency carrier component may be obtained by designing a filter 34 to embody the principle that the stopband attenuation of the filter varies greatly with the order of the filter whereas the pass band phase shift at frequencies much less than the cut-off frequency of the filter varies only slightly with the order of the filter. This fact may be demonstrated as follows for a maximally-flat (Butterworth) low-pass filter;

The magnitude response for a Butterworth low-pass filter is:

$$M(\omega) \simeq \frac{1}{(1 + \omega^{2n})^{\frac{1}{2}}}$$

where n is the order of the filter, and is the frequency (normalized by the cut-off frequency). (See, for example, F. F. Kuo, Network Analysis and Synthesis, John Wiley and Sons, 1966, pp. 368–72.) For much greater than unity (frequencies much greater than the cut-off frequency), the magnitude response is given approximately by $$M(\omega) \simeq \frac{1}{\omega^n}$$

or, in decibels, $$20 \log M(\omega) \simeq -20n \log \omega$$

Note that, for every increase of one in the order of the filter, an additional 20 decibels of attenuation is introduced.

The transfer function $H(j\omega)$ can be expressed as follows (see Kuo), $$H(j\omega) = \frac{1}{1 + a_1 j\omega + a_2(j\omega)^2 + \ldots + a_n(j\omega)^n}$$

where $a_k$ (k=1,2, . . . ,n) are the coefficients of the Butterworth polynomials of order $n^k$.

For smaller values of $\omega$ (frequencies much less than the cut-off frequency), $$H(j\omega) \simeq \frac{1}{1 + j\omega a_1}$$

and the phase shift is given by the argument of $H(j\omega)$:

$$\text{Arg } H(j\omega) \simeq -\tan^{-1}(\omega a_1)$$

Note that, to a first order approximation, the phase shift is a constant value dependent only on the relationship between the frequency of interest (60 Hz) and the cut-off frequency of the filter. Although $a_1$ is a function of n, it changes only very slowly as n changes. Increases in the order of the filter cause contributions to the phase shift from the higher order terms in $H(j\omega)$. However, these additional contributions become progressively smaller as n is increased.

The above discussion suggests the following design procedure for obtaining the filter design specifications detailed above:

1. A desired limit is set on the magnitude of the filter transfer function at the carrier frequency (i.e., the attenuation should be greater than or equal to a desired value when the frequency is equal to the demodulator carrier frequency. The demodulator carrier frequency will be one-half the unmodulated frequency of voltage controlled oscillator 13, e.g., 50 KHz if the centre frequency of voltage controlled oscillator 13 is 100 KHz.).

2. A desired limit is placed on the phase shift at the signal frequency of interest (60 Hz). That is, the phase shift should be less than a certain amount (say 0.5 degrees) at a frequency of 60 Hz.

3. An initial value of n is chosen which determines the order of the filter. A low value of n should be chosen initially.

4. Using the limit on the attenuation and the transfer function determined by the chosen value of n, an equation with the filter cut-off frequency as the only unknown is obtained. This equation is solved to give the largest value of filter cut-off frequency consistent with the desired attenuation and the chosen value of n.

5. Using the chosen value of n and the filter cut-off frequency determined above, the phase shift is calculated at the signal frequency of interest (60 Hz in this case).

6. If the phase shift as calculated in (5) is less than the required maximum, the proper value of n has been found and the corresponding transfer function can be implemented in any of the usual filter realizations (see, for example, Hilburn and Johnson, Manual of Active Filter Design, McGraw-Hill, 1973). If the phase shift as calculated in (5) is greater than the required maximum, choose a larger value of n and repeat the above procedure starting at step number (4).

From the above design procedure, it can be seen that as low a value of n (lowest order filter) as possible is desirable consistent with the required specifications. This low value of n is desirable because high order filters are more complex and more expensive than low order filters. One way to reduce the order of the filter required is to use as high a carrier frequency as possible, consistent with restrictions due to upper frequency limits on the active components (integrated circuits, light emitters and detectors). The unmodulated frequency of voltage controlled oscillator 13 may then be chosen to be as high as possible subject to the upper frequency limit of voltage controlled oscillator 13.

Phase locked loop 33 itself contains a loop filter which in combination with other components of the phase locked loop produces a low pass filtering of demodulated signal S57. The loop filter portion must be carefully designed to minimize phase shift at 60 Hz, and this may be done using techniques similar to those used for the design of active filter 34.

Figure 4:
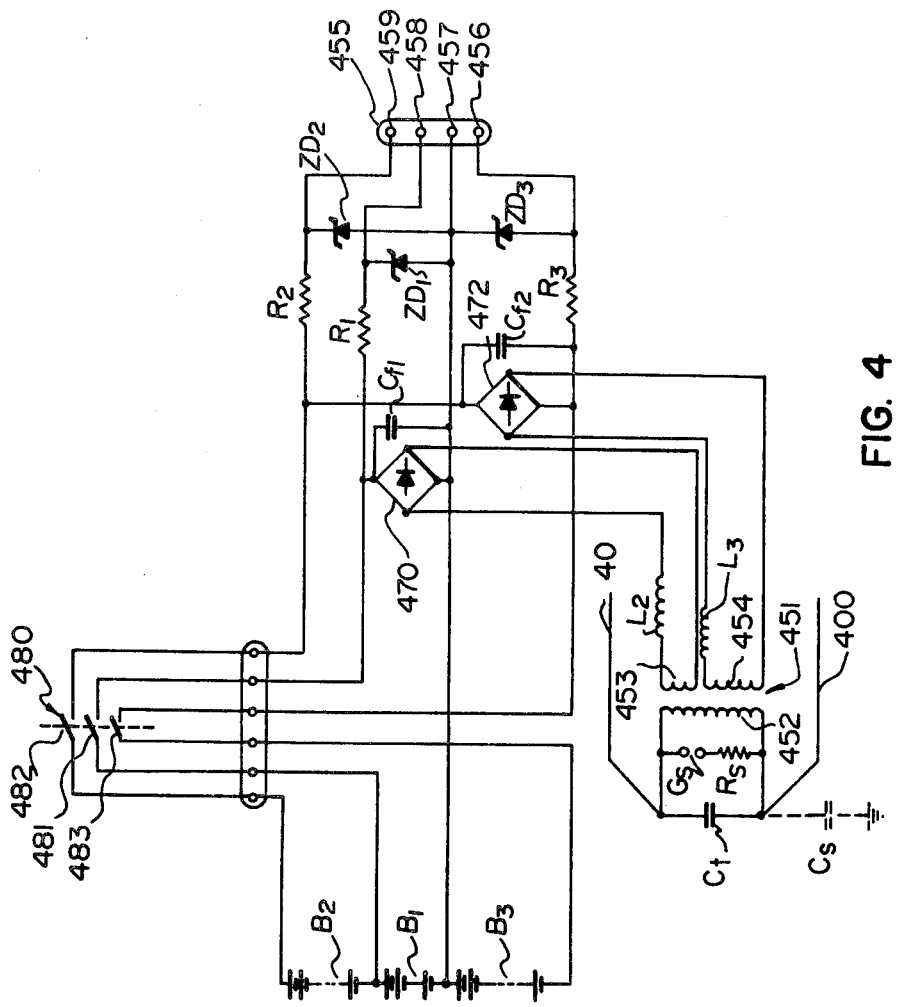
FIG. 4 is a schematic diagram showing in more detail the power conditioning means depicted in FIG. 1.

FIG. 4 shows in more detail elements and circuitry of power conditioning means 450 depicted in FIG. 1. In FIG. 4, high voltage conductor 40 is shown as a line 40 and cylindrical metallic structure 400 is shown as a line 400. The circuitry includes at its input a transformer 451 having a primary winding 452 in parallel connection with capacitor $C_t$. At the output, there is provided a connector 455 having output terminals 456, 457, 458 and 459 to which lines 460, 461, 462 and 463 (shown in FIG. 1 but not FIG. 4) interconnecting with transmitter 100 are respectively connected.

Transformer 451 has two secondary windings 453, 454. Secondary winding 453, which is in series connection with tuning inductor $L_2$, is connected across the input of bridge rectifier 470. Secondary winding 454, which is in series connection with tuning inductor $L_3$, is connected across the input of bridge rectifier 472.

The output of bridge rectifier 470 is connected to the input of a first voltage regulator which comprises filter capacitor $C_{f1}$, current limiting resistor $R_1$, and zener diode $ZD_1$. The output of this voltage regulator is taken across terminals 458 and 457 of connector 455, terminal 457 serving as a ground return reference.

The output of bridge rectifier 472 is divided across the inputs of second and third voltage regulators. The second voltage regulator comprises current limiting resistor $R_2$ and zener diode $ZD_2$. The third voltage regulator comprises current limiting resistor $R_3$ and zener diode $ZD_3$. The output of the second voltage regulator is taken across terminals 459 and 457 of connector 455 and the output of the third voltage regulator is taken across terminals 456 and 457 of connector 455.

Filter capacitor $C_{f2}$ in FIG. 4 may be considered as forming part of both the second and the third voltage regulators in that it performs a filtering action across the entire output of rectifier 472.

The power conditioning means of FIG. 4 also includes a battery pack comprising batteries $B_1$, $B_2$ and $B_3$. These batteries may be connected to or disconnected from the remaining circuitry by means of remote controlled switch 480 which is shown with switch contacts 481, 482 and 483 in an open position. When the switch contacts are closed, the batteries may not only provide regulating and filtering action, but may also sustain power output to transmitter 100 for a period of time in the event of a loss of power input from high voltage conductor 40. Of course, the length of time the batteries can provide such standby power will depend on their capacity and their initial state of charge at the time a power failure occurs. Typically, the output of rectifiers 470 and 472 will be full wave rectified signals and may include undesirable transient voltages. Batteries $B_1$, $B_2$ and $B_3$ act to substantially remove the ripple component of the rectified signals and, since they exhibit the passive characteristics of large capacitors, filter and substantially reduce the magnitude of undesirable transient voltages.

The purpose of tuning inductors $L_2$ and $L_3$ is to enable maximum power transfer from high voltage conductor 40 to the loads presented by transmitter 100. Generally, the value of stray capacitance $C_s$ between metallic structure 400 and electrical ground will be made as large as possible in order to increase the amount of power which can be derived. This value may be increased by increasing the diameter of metallic structure 400 or by decreasing the clearance distance between the structure and electrical ground. However, the physical space available on a high voltage conductor 40 for a structure such as cylindrical metallic structure 400 will often be limited. Further, it has been found that distance from ground does not greatly affect the value of stray capacitance $C_s$ once the distance exceeds a few feet. By reason of such limitations, it has been found to be highly desirable to include means such as tuning inductors $L_2$ and $L_3$ for maximizing power transfer. Inductors $L_2$ and $L_3$ are selected to tune out the capacitive reactance formed by the parallel combination of capacitor $C_t$ and stray capacitance $C_s$.

It should be understood that although two tuning inductors are shown in FIG. 4, similar results may be achieved by other means. For example, a tuning inductor may also be inserted in the primary circuit of transformer 451. Or, all the required inductance may be consolidated into a single inductor in the primary circuit. In addition, although such inductors are indicated as discrete elements, they may be formed in whole or in part by leakage inductance built in with the design of transformer 451. Ultimately, there is an equivalent series inductance between the high voltage conductor 40 as a power source and the loads presented by transmitter 100. In any case, the values of inductance required for a given application can be determined using classical circuit analysis techniques. Alternately, a physical model of the circuit can be made and the inductances varied until the average current from the rectifiers or the power input to the power conditioning means is a maximum.

The power conditioning means of FIG. 4 also shows protective circuit means for protecting against overvoltage conditions between high voltage conductor 40 and cylindrical metallic structure 400. The protective circuitry shown consists of a conventional spark gap $G_s$ and current limiting resistor $R_s$ for suppressing overvoltages of a transient nature. If overvoltages of a sustained nature are apt to be encountered, then additional protective circuitry may be considered desirable. For example, a normally open latching protector (not shown) may be used to effectively short circuit high voltage conductor 40 to metallic structure 400 upon the occurrence of an overvoltage condition which endures longer than a predetermined amount of time. When a sustained over-voltage condition develops, the latching protector closes to establish the short circuit and remains closed until manually reset.

The selection of component values in the design of a power supply as shown in FIGS. 1 and 4 will of course depend upon the voltage of high voltage conductor 40 and the voltage and power requirements of the load presented by transmitter 100. Using a cylindrical metallic structure 400 approximately one foot in diameter, two feet in length, and capped with six inch toroids 420 approximately two feet in diameter, the general design indicated has been used to produce approximately 2 watts of direct current power from a 133 $KV_{rms}$ transmission line. Such power was supplied at approximate operating voltages of +5.1 volts (terminals 458 to 457), +15 volts (terminals 459 to 457), and −15 volts (terminals 456 to 457). The structure was mounted on the transmission line about 26 feet above ground resulting in a stray capacitance $C_s$ of approximately 40 pF. The selected value of capacitor $C_t$ was 2200 pF. Spark gap $G_s$ was a 6 KV spark gap, and current limiting resistor $R_s$ was 1 ohm. Although not shown, a latching protector as mentioned above was also used. It comprised a 3/16" spring loaded brass plunger in a ⅜" cylinder with high voltage cap nut contacts. Batteries $B_1$, $B_2$ and $B_3$ were formed by a 24 cell nickel-cadmium battery pack tapped after 0, 12, 17 and 24 cells, the 12th cell tap being connected directly to terminal 457 as the ground reference.

The invention should not be considered as limited to the specific embodiments which have been described. A variety of design possibilities and variations within the scope of the following claims will undoubtedly occur to those skilled in the art.

We claim:

1. Current sensing apparatus for sensing and producing an amplitude and phase angle replica of a high voltage alternating current signal carried in a high voltage conductor, said apparatus comprising:
   (a) a toroidal coil encircling said high voltage conductor for producing a low level electrical signal representative of the time derivative of said high voltage alternating current signal; and,
   (b) transmitter means electrically connected to said coil and presenting a high input resistance thereto, said transmitter means being operative at or near the electrical potential of said conductor and remote from electrical ground for receiving said low level electrical signal and for producing in response thereto a series of modulated pulses of electromagnetic energy containing amplitude and phase angle replica information representative of said high voltage alternating current signal.

2. Current sensing apparatus as defined in claim 1, wherein the series of modulated pulses is produced in the form of a series of frequency modulated pulses, the frequency of which is a function of the amplitude of said high voltage alternating current signal.

3. Current sensing apparatus as defined in claim 1, wherein said pulses of electromagnetic energy are light energy pulses.

4. Current sensing apparatus as defined in claim 3, wherein said coil comprises a magnetically non-saturating core material.

5. Current sensing apparatus as defined in claim 4, wherein the core material is a non-magnetic material.

6. Current sensing apparatus as defined in claim 4, wherein the core material is ferrite.

7. Current sensing apparatus as defined in claim 4, wherein the core material is a magnetic material and includes a discontinuity for preventing saturation.

8. Current sensing apparatus as defined in claim 7, wherein the discontinuity is formed by an air gap in the core material.

9. Current sensing apparatus as defined in claim 3, 4 or 5, wherein the series of modulated pulses is produced in the form of a series of frequency modulated pulses, the frequency of which is a function of the amplitude of said high voltage alternating current signal.

10. Current sensing apparatus as defined in claim 6, 7 or 8, wherein the series of modulated pulses is produced in the form of a series of frequency modulated pulses, the frequency of which is a function of the amplitude of said high voltage alternating current signal.

11. Current sensing apparatus as defined in claim 3, further including optical transmission line means optically coupled to said transmitter means for transmitting said light energy pulses to a receiver means operating at or near electrical ground potential.

12. Current sensing apparatus as defined in claim 3, further including optical transmission line means and receiver means,
   (a) said optical transmission lines means optically interconnecting said transmitter means and said receiver means for transmitting said light energy pulses from said transmitter means to said receiver means,
   (b) said receiver means operating at or near electrical ground potential for receiving the transmitted light energy pulses and converting same into a second low level electrical signal representative of said high voltage alternating current signal in both amplitude and phase angle.

13. Current sensing apparatus as defined in claim 12, wherein the series of modulated pulses is produced in the form of a series of frequency modulated pulses, the frequency of which is a function of the amplitude of said high voltage alternating current signal.

14. Current sensing apparatus as defined in claim 11, 12 or 13, wherein said optical transmission line means comprises a glass fibre cable.

15. Current sensing apparatus as defined in claim 1, 2 or 3, wherein the ratio of the self inductance of the toroidal coil to the input resistance of the transmitter means is less than 23 microseconds.

16. Current sensing apparatus as defined in claim 11, 12 or 13, wherein the ratio of the self inductance of the toroidal coil to the input resistance of the transmitter means is less than 23 microseconds.

17. Current sensing apparatus as defined in claim 2, 3 or 13, wherein the frequency of said high voltage alternating current signal is about 60 Hz and the average frequency of said series of frequency modulated pulses is of the order of 100 KHz.

18. Current sensing apparatus as defined in claim 1, 2 or 3, including power supply means operatively connected to said high voltage conductor and to said transmitter means for receiving input power from said high voltage conductor and providing direct current operating power to said transmitter means.

19. Current sensing apparatus as defined in claim 11, 12 or 13, including power supply means operatively connected to said high voltage conductor and to said transmitter means for receiving input power from said high voltage conductor and providing direct current operating power to said transmitter means.

20. Current sensing apparatus as defined in claim 1, 2 or 3, including power supply means operatively connected to said high voltage conductor and said transmitter means for receiving input power from said high voltage conductor and providing direct current operating power to said transmitter means, said power supply means comprising:
   (a) a cylindrical metallic structure supported remote from electrical ground potential in co-axial alignment around said conductor;
   (b) capacitor means electrically connected beween said high voltage conductor and said metallic structure for providing in response to the flow of high voltage alternating current in said conductor an alternating current voltage the magnitude of which is dependent upon the capacitance of said capacitor means and upon stray capacitance between said metallic structure and electrical ground; and,
   (c) power conditioning means electrically connected between said capacitor means and said transmitter means for receiving the alternating current voltage provided by said capacitor means and for providing in response thereto said direct current operating power.

21. Current sensing apparatus as defined in claim 1, 2 or 3, including power supply means operatively connected to said high voltage conductor and said transmitter means for receiving input power from said high voltage conductor and providing direct current operating power to said transmitter means, said power supply means comprising:
   (a) a cylindrical metallic structure supported remote from electrical ground potential in co-axial alignment around said conductor, said structure housing said toroidal coil and said transmitter means;
   (b) capacitor means housed within said metallic structure and electrically connected beween said high voltage conductor and said metallic structure for providing in response to the flow of high voltage alternating current in said conductor an alternating current voltage the magnitude of which is dependent upon the capacitance of said capacitor means and upon stray capacitance between said metallic structure and electrical ground; and,
   (c) power conditioning means electrically connected between said capacitor means and said transmitter means for receiving the alternating current voltage provided by said capacitor means and for providing in response thereto said direct current operating power.

22. Current sensing apparatus as defined in claim 11, 12 or 13, including power supply means operatively connected to said high voltage conductor and said transmitter means for receiving input power from said high voltage conductor and providing direct current operating power to said transmitter means, said power supply means comprising:
   (a) a cylindrical metallic structure supported remote from electrical ground potential in co-axial alignment around said conductor;
   (b) capacitor means electrically connected beween said high voltage conductor and said metallic structure for providing in response to the flow of high voltage alternating current in said conductor an alternating current voltage the magnitude of which is dependent upon the capacitance of said capacitor means and upon stray capacitance between said metallic structure and electrical ground; and,
   (c) power conditioning means electrically connected between said capacitor means and said transmitter means for receiving the alternating current voltage provided by said capacitor means and for providing in response thereto said direct current operating power.

23. Current sensing apparatus as defined in claim 11, 12 or 13, including power supply means operatively connected to said high voltage conductor and said transmitter means for receiving input power from said high voltage conductor and providing direct current operating power to said transmitter means, said power supply means comprising:
   (a) a cylindrical metallic structure supported remote from electrical ground potential in co-axial alignment around said conductor, said structure housing said toroidal coil and said transmitter means;
   (b) capacitor means housed within said metallic structure and electrically connected between said high voltage conductor and said metallic structure for providing in response to the flow of high voltage alternating current in said conductor an alternating current voltage the magnitude of which is dependent upon the capacitance of said capacitor means and upon stray capacitance between said metallic structure and electrical ground; and,
   (c) power conditioning means electrically connected between said capacitor means and said transmitter means for receiving the alternating current voltage provided by said capacitor means and for providing in response thereto said direct current operating power.

24. Current sensing apparatus as defined in claim 13, wherein said transmitter means comprises:
   (a) integrator means electrically connected to said toroidal coil for receiving as an input said first-recited low level electrical signal and providing as an output an electrical integral signal, said electrical integral signal being a low level replica of said high voltage alternating current signal;
   (b) voltage controlled oscillator means for providing a frequency modulated electrical pulse signal output at a preselected carrier frequency;
   (c) interface means electrically interconnecting said integrator means and said oscillator means, said interface means for receiving said electrical integral signal as an input, shifting the DC biasing level thereof, and providing the level shifted signal as an output to said oscillator means to thereby modulate the frequency of said pulse signal output by the instantaneous value of the level shifted signal;
   (d) monostable multivibrator means electrically connected to said oscillator means for receiving the modulated pulse signal output of said oscillator means as an input and providing as an output a corresponding electrical pulse train signal having a low duty cycle;
   (e) driver means electrically connected to said multivibrator means for receiving said electrical pulse train signal as an input and providing a corresponding amplified electrical pulse train signal as an output; and,
   (f) a light emitting device electrically connected to said driver means for receiving said amplified pulse train signal as an input and provided in response thereto said light energy pulses as an output to said optical transmission line means.

25. Current sensing apparatus as defined in claim 24, wherein said receiver means comprises:
  (a) photodetector means for receiving said transmitted light energy pulses as an input and providing a corresponding electrical pulse train signal as an output;
  (b) pulse amplifier means electrically connected to said photodetector means for receiving the electrical pulse train signal from the photodetector as an input and providing a corresponding amplified electrical pulse train signal as an output;
  (c) frequency dividing means electrically connected to said pulse amplifier means for receiving the amplified electrical pulse train signal from the pulse amplifier as an input, halving the frequency thereof, and providing as an output a corresponding frequency divided pulse signal having a 50 percent duty cycle;
  (d) phase locked loop means electrically connected to said frequency dividing means for receiving as an input said frequency divided pulse signal and providing as an output a demodulated signal the frequency of which varies with variation in the frequency of said frequency divided pulse signal;
  (e) active filter means electrically connected to said phase locked loop means for receiving as an input said demodulated signal, removing therefrom signal components having a frequency higher than the frequency of said high voltage alternating current signal, and providing as an output said second low level electrical signal.

26. A method of sensing and producing an amplitude and phase angle replica of a high voltage alternating current signal carried in a high voltage conductor comprising the steps of;
  (a) sensing said high voltage alternative current signal and producing at or near the electrical potential of said high voltage conductor a first low level electrical signal representative of the time derivative thereof;
  (b) converting said first low level signal into a series of modulated pulses of electromagnetic energy containing amplitude and phase angle replica information representative of said alternating current signal;
  (c) transmitting said series of modulated pulses to receiving apparatus operating at or near electrical ground potential and remote from the electrical potential of said high voltage conductor; and,
  (d) receiving said transmitted pulses and converting them into a second low level electrical signal representative of said alternating current signal in both amplitude and phase angle.

27. A method as defined in claim 26, wherein the series of modulated pulses is produced as a series of frequency modulated pulses, the frequency of which is a function of the amplitude of said high voltage alternating current signal.

28. A method as defined in claim 26, wherein the series of modulated pulses of electromagnetic energy is produced as a series of modulated pulses of light energy.

29. A method as defined in claim 28, wherein the series of modulated pulses is produced as a series of frequency modulated pulses, the frequency of which is a function of the amplitude of said high voltage alternating current signal.

30. A method as defined in claim 29, wherein the series of modulated pulses of light energy are transmitted to said receiving apparatus through an electrically insulating and optically conducting glass fibre cable.

31. A method as defined in claim 26, 27 or 28, further including the use of input power from said high voltage conductor in the performance of the steps up to and including said transmitting step.

32. A method as defined in claim 29 or 30, further including the use of input power from said high voltage conductor in the performance of the steps up to and including said transmitting step.

* * * * *

UNITED STATES PATENT AND TRADEMARK OFFICE
CERTIFICATE OF CORRECTION

PATENT NO. : 4,471,355

DATED : September 11, 1984

INVENTOR(S) : Robert H.S. Hardy and Jay E. Beattie

It is certified that error appears in the above-identified patent and that said Letters Patent is hereby corrected as shown below:

Column 7, line 65, after "368-72.)" start a new paragraph.

Signed and Sealed this

Sixteenth Day of April 1985

[SEAL]

Attest:

DONALD J. QUIGG

Attesting Officer

Acting Commissioner of Patents and Trademarks